United States Patent [19]

April

[11] Patent Number: 4,504,973
[45] Date of Patent: Mar. 12, 1985

[54] AUTOMATIC DISABLING OF AFC/AFT CONTROLLER DURING RECEIVER CIRCUIT TUNING

[75] Inventor: Georges E. April, Montreal, Canada
[73] Assignee: AED Satellite Systems, Ltd., Canada
[21] Appl. No.: 585,874
[22] Filed: Mar. 2, 1984
[51] Int. Cl.³ .............................................. H04B 1/26
[52] U.S. Cl. ................................... 455/192; 455/208; 455/263
[58] Field of Search .............. 455/205, 208, 257, 258, 455/263, 164, 182, 192; 358/195.1

[56] References Cited

U.S. PATENT DOCUMENTS

| | | | |
|---|---|---|---|
| 2,496,063 | 1/1950 | Mural | 455/192 |
| 3,328,700 | 6/1967 | Chipman | 455/192 |
| 3,619,492 | 11/1971 | Evans | 358/195.1 |
| 3,743,944 | 7/1973 | Bridgewater | 455/164 |
| 3,806,817 | 4/1974 | Uchida | 455/257 |
| 3,867,568 | 2/1975 | Merriweather | 358/195.1 |
| 3,869,674 | 3/1975 | Borbely | 455/192 |
| 3,889,193 | 6/1975 | Sasaki et al. | 455/192 |
| 3,939,427 | 2/1976 | Mueller | 455/257 |
| 3,968,437 | 7/1976 | Ong | 455/192 |
| 3,968,441 | 7/1976 | Garskamp | 455/164 |
| 4,234,961 | 11/1980 | Garskamp | 455/192 |

Primary Examiner—Jin F. Ng
Attorney, Agent, or Firm—Fishman & Dionne

[57] ABSTRACT

An electromagnetic wave receiver system with an AFC/AFT controller and an adjustable tuner has the improvement whereby the AFC/AFT controller is automatically disabled when the tuner is being adjusted. The automatic disabling is implemented by a sensor which senses when the tuning means is being adjusted and which generates an electric signal when such adjusting is sensed. The electric signal is then applied to an OFF terminal of the AFC-AFT controller to thereby disable the controller when the receiver is being tuned.

7 Claims, 1 Drawing Figure

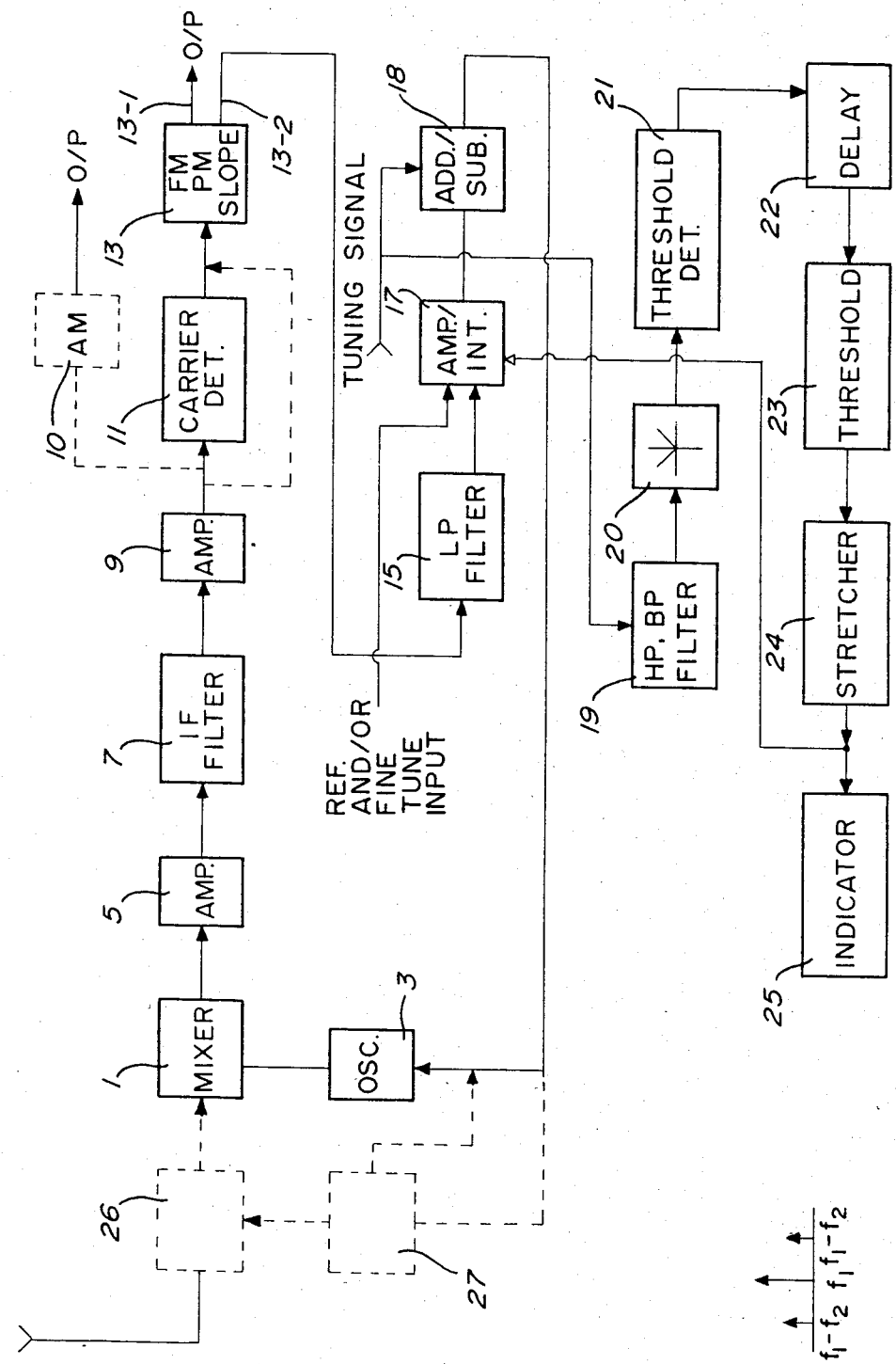

AUTOMATIC DISABLING OF AFC/AFT CONTROLLER DURING RECEIVER CIRCUIT TUNING

BACKGROUND OF THE INVENTION (a) Field of the Invention

The invention relates to improvements in electromagnetic wave receiver systems having AFC/AFT circuits and adjustable tuning means. More specifically, the invention relates to a circuit for automatically disabling the AFC/AFT when the system is being tuned.

(b) Description of Prior Art

It is known to use Automatic Frequency Control (AFC) and Automatic Fine Tuning (AFT) circuits for maintaining the tuning of frequency of receivers such as FM receivers and television receivers lined to the frequency of a selected radio or television station. Although AFC/AFT is useful for maintaining the alignment of frequencies when the receiver has been tuned, the signals provided by the AFC/AFT could provide problems when attempting to tune to a different station or channel. Specifically, if the AFC/AFT signal is strong enough, then the AFC will "pull" the receiver to the frequency at which it was last set even though the tuning dial is being turned. The AFC/AFT will only "let go" after the distance between the originally set frequency and the tuning dial is sufficiently large to overcome the effect of the AFC/AFT signal.

If there are any stations transmitting at frequencies in the space between the frequency at which the receiver was originally set and the frequency at which the AFC/AFT lets go, the output will not be detected by the receiver because of this effect on the AFC/AFT signal. For this reason, especially in FM receiver sets, there is provided an AFC ON/OFF switch whereby the AFC can be manually disabled during tuning. However, the purpose of this switch is usually not understood by the user of the set, so that the AFC/AFT is very seldom manually disabled when the set is being tuned. Even if it were understood, as it is left to the user to manually disable the AFC/AFT, it is quite conceivable that the switch will never be used. If it is used, it is possible that the user will forget to enable the AFC/AFT once he has completed tuning, so that the receiver will be operating without benefit of the AFC/AFT circuit.

(c) Objects

It is therefore an object of the invention to provide an improvement to electromagnetic wave receiver systems as above-described wherein the AFC/AFT is automatically disabled on tuning.

It is a more specific object of the invention to provide a circuit which senses when tuning is taking place and which automatically disables the AFC/AFT at such time.

SUMMARY OF THE INVENTION

In accordance with the invention there is provided for use in an electromagnetic wave receiver system having AFC/AFT control means and adjustable tuning means, the improvement comprising means for automatically disabling the AFC/AFT control means when the tuning means is being adjusted.

The means may comprise sensor means for sensing when the tuning means is being adjusted and for generating an electric signal when such adjusting is sensed, and means for applying the electric signal to the AFC/AFT control means to thereby disable the AFC/AFT control means.

BRIEF DESCRIPTION OF THE DRAWING

The invention will be better understood by an examination of the following description together with the accompanying drawing which illustrates in block diagram form an AFC/AFT circuit including the improvement as above-described.

DESCRIPTION OF PREFERRED EMBODIMENTS

Referring to the drawing, an RF signal at the tuned frequency of the receiver is fed to one input terminal of the mixer 1 whose other input terminal is fed from an oscillator 3. The frequency of the oscillator is offset by a predetermined amount from the tuned frequency of the receiver (e.g. 10.7 MHz in FM receivers).

As is well known, the output of the mixer will be a spectrum of frequencies including the offset frequency.

The output of the mixer is fed, through an amplifier 5, to an IF filter 7. The IF filter eliminates all frequencies other than the offset frequency.

The output of 7 is fed, through amplifier 9, to a carrier detector 11. The carrier detector is required only if the receiver is an AM receiver, e.g., standard T.V. video signal which uses a modified AM modulation scheme. In an FM receiver, the output of 9 is fed directly to detector 13. If the frequency to which the receiver is tuned is aligned with the received frequency, then a predictable signal which could be 0 is fed from output 13-2 of 13 to low pass filter 15. If there is a deviation, then there will be a deviation from the predictable signal which will be a low frequency component at the output 13-2.

Detector 13 is also a demodulator for the FM signal and the modulated signal is fed from output 13-1 of 13 to amplification circuits and speakers, as is well known in the art. (In many cases, a single output from 13 provides a function of 13-1 and 13-2). In an AM receiver, demodulator 10 is provided to provide a demodulated signal.

The output of the filter 15 is fed to one input terminal of amplifier/integrator 17. The other input terminal is fed from a source of a reference signal which compensates for the offset of the amplifier, and the nominal value of output at 13-2. If the amplifier offset is sufficiently small in magnitude, and if the nominal output of 13-2 is also nominally zero, then the reference line can be connected to ground.

Assuming that the tuned frequency is aligned with the received frequency, then a predictable output will be applied at the output terminal of 17. The predictable signal can, of course, be 0.

As is well known in the art, the detector 13 provides a voltage output whose amplitude is representative of deviations from the nominal carrier in the FM mode. (The nominal carrier frequency is the frequency to which the FM radio is tuned. It comprises a central frequency of the transmitter which central frequency is varied in accordance with the amplitude of the modulating signal.) Thus, the output of 13 is a slowly varying voltage.

When the slowly varying voltage is applied to the low pass filter 15, the output of the filter is the average value at the output of 13, that is, the DC level about which the slowly varying signal varies. As is well known, the average voltage is representative of the average frequency at the input to 13. As the input to 13 is the received signal, the elements 13 and 15 comprise means for determining the average frequency value of the received signal.

As the reference applied to the other terminal of 17 is representative of the tuned frequency, the AMP/INT 17 comprises a means for detecting whether the average frequency value is equal to the tuned frequency value of the receiver.

In any case, the output of 17 is applied through Add-/Substract circuit 18 to the control terminal of the tunable oscillator 3. If the signal is different from the predicted signal, the frequency of the oscillator 3 will be varied. In this way, the frequency of the receiver is automatically controlled.

In order to disable the AFC/AFT automatically when the receiver is being re-tuned, additional elements 19 to 24 are provided. 19 is a filter (high-pass or band-pass), and the tuning signal by which the reciever is tuned is applied to the input of 19. The output of 19 is fed to the absolute value detector 20 which will detect either a positive or a negative output from 19 and transform it into a unipolar output. (Either positive or negative).

The output of 20 is fed to threshold detector 21 which will pass only signals above a predetermined threshold. This is to ensure that the AFC/AFT is not disabled every time some noise passes through filter 19.

As a further guard against noise disablement, the output of threshold detector 21 is fed to delay circuit 22 whose output is fed to a second threshold detector 23. Basically, the elements 21, 22 and 23 provide a test to determine that the signal at the output 20 indeed detects the re-tuning of the receiver rather than noise or other spurious signals. It is obvious that, depending on conditions, some or all of 21 to 23 may be omitted or combined in a single unit. When the test has been passed, the signal is applied to pulse stretcher 24 whose output is fed to a disable terminal of amplifier 17. The stretcher ensures that the signal which has been detected as a tuning signal is maintained long enough to disable the amplifier. When the amplifier is disabled then the AFC/AFT signal is no longer operative, so that the receiver can be re-tuned without the influence of the AFC/AFT signal.

Optional elements of the circuit are the indicator 25 which is actuated during tuning. RF filter 26 may also be provided and this may be a fixed or a tuned filter. Also optional is conditioning circuit 27. When the conditioning circuit 27 is used, then the output of 18 is fed to 27, and the output of 27 is fed both to the filter 26 and to the control terminal of oscillator 3.

It can be seen from the above description that when the receiver is being tuned, a signal will be provided by the elements 19 to 24 to disable the amplifier 17 and to thereby remove the AFC/AFT signal. Accordingly, the receiver can be tuned without the influence of AFC/AFT signal.

When the receiver is not being tuned, then no signal will be developed by the elements 19 to 24 so that the amplifier 17 will remain enabled.

Although a particular embodiment has been described, this was for the purpose of illustrating, but not limiting, the invention. Various modifications, which will come readily to the mind of one skilled in the art, are within the scope of the invention as defined in the appended claims.

I claim:

1. An electromagnetic wave receiver system for processing a received signal, said received signal having an average frequency value, and having automatic frequency control/automatic frequency tuning (AFC/AFT) control means and adjustable tuning means for setting a tuned frequency value;

said AFC/AFT control means comprising:
means for determining the average frequency value of a received signal; and
means for detecting whether the average frequency value is equal to the tuned frequency value of the receiver, comprising, amplifier/integrator (AMP/INT) means having one input thereof connected to an output of said means for determining the average frequency value of the received signal, and a second input thereof connected to a reference signal representative of said tuned frequency value;
means for automatically disabling said AFC/AFT control means when the tuning means is being adjusted;
said means for automatically disabling comprising:
sensor means for sensing when the tuning means is being adjusted and for generating an electric signal when such adjusting is sensed;
means for applying said electric signal to said means for detecting whether the average frequency value is equal to the tuned frequency value of said AFC/AFT control means to thereby disable said AFC/AFT control means by forcing the output of said AMP/INT to a predetermined value which is a function of the reference signal.

2. The improvement as defined in claim 1 and including conductive means for applying a tuning signal, indicative of said adjustment, to said sensor means;
wherein, when said tuning means is being adjusted, said tuning signal is applied to said sensor means.

3. The improvement as defined in claim 2 wherein said sensor means comprises a filter to prevent noise and other spurious signals from disabling said AFC/AFT control means, said filter comprising conductive means for applying said tuning signal to said filter;
said tuning signal being applied to the input of said filter.

4. The improvement as defined in claim 3 wherein said filter means includes conductive means at the output thereof for applying the output of said filter to an absolute value detector whereby either positive or negative tuning signals will provide a unipolar said electric signal.

5. The improvement as defined in claim 4 wherein said absolute detector comprises conductive means at the output thereof for applying the output of said absolute detector to a threshold detector to thereby eliminate signals below a predetermined value, to thereby provide a safeguard against noise being permitted to disable said AFC/AFT control means.

6. The improvement as defined in claim 5 wherein said threshold detector comprises conductive means at the output thereof to apply the output of said threshold detector to a delay circuit, the output of said delay circuit is applied to a second threshold detector, and the output of said second threshold detector is applied to a stretcher;
said electrical signal being supplied at the output of said stretcher.

7. The improvement as defined in claim 6 wherein said stretcher comprises conductive means at the output thereof for applying the output of said stretcher to an ON/OFF terminal of said AMP/INT means;
whereby, when a signal is applied to the ON/OFF terminal of said AMP/INT means, said AFC/AFT control means is disabled.

* * * * *